(12) United States Patent
Seth et al.

(10) Patent No.: US 7,538,613 B2
(45) Date of Patent: May 26, 2009

(54) SYSTEMS AND METHODS FOR COMMON MODE DETECTION

(75) Inventors: Sumantra Seth, Bangalore (IN); Kanan Saurabh, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/365,143

(22) Filed: Feb. 28, 2006

(65) Prior Publication Data

US 2007/0200630 A1    Aug. 30, 2007

(51) Int. Cl.
*H03F 3/45*    (2006.01)
(52) U.S. Cl. .................................................. 330/258
(58) Field of Classification Search ................ 330/258
See application file for complete search history.

(56) References Cited

U.S. PATENT DOCUMENTS

| | | | |
|---|---|---|---|
| 5,283,535 A * | 2/1994 | Sevenhans et al. | 330/253 |
| 5,613,233 A * | 3/1997 | Vagher | 455/296 |
| 6,504,432 B1 * | 1/2003 | Rokhsaz | 330/258 |
| 6,768,443 B2 * | 7/2004 | Willis | 341/172 |
| 7,061,279 B1 * | 6/2006 | Leete | 327/65 |

* cited by examiner

*Primary Examiner*—Robert Pascal
*Assistant Examiner*—Alan Wong
(74) *Attorney, Agent, or Firm*—Ronald O. Neerings; Wade James Brady, III; Frederick J. Telecky, Jr.

(57) ABSTRACT

Various systems and methods for common mode detection are disclosed. As one example, a common mode detection circuit including a differential input stage, a common mode replica stage, and an amplifier is disclosed. The differential input stage exhibits an input common mode, and includes two differential inputs. A signal from the differential input stage representing the input common mode is electrically coupled to an input of the amplifier. Another input of the amplifier is electrically coupled to the common mode replica stage, and the amplifier outputs a signal indicative of the input common mode.

19 Claims, 6 Drawing Sheets

SYSTEMS AND METHODS FOR COMMON MODE DETECTION

BACKGROUND OF THE INVENTION

The present invention is related to systems and methods for providing differential signaling.

FIG. 1 shows a simplified diagram 100 of differential signaling with a differential signal 110 switching from a high voltage ($V_{high}$) to a low voltage ($V_{low}$), and another differential signal 120 switching from $V_{low}$ to $V_{high}$. A common mode voltage ($V_{cm}$) 130 is also depicted. Common mode voltage is the average of $V_{high}$ and $V_{low}$ as set forth in the following equation:

$$V_{cm} = (V_{high} + V_{low})/2$$

A number of applications utilize differential signaling. As an example, differential signaling is used for the Universal Serial Bus that is supported by many personal computer manufacturers. In the current 480 Mbps mode operable on the Universal Serial Bus, the common mode voltage may vary from negative fifty mV to six hundred mV, and exhibit a differential signal swing of only four hundred mV. When the Universal Serial Bus was originally developed, semiconductor processes were typically 3.3 volts or higher. At such voltage levels, the common mode variation was often manageable. Currently, however, a typical semiconductor processes are 1.8 volts, and the trend is moving toward lower and lower voltages. At these lower voltages, common mode variation may become significant and unmanageable using known techniques, especially when differential signaling from legacy devices is encountered.

Hence, for at least the aforementioned reasons, there exists a need in the art for advanced systems and methods for performing differential signaling.

BRIEF SUMMARY OF THE INVENTION

The present invention is related to systems and methods for providing differential signaling.

Some embodiments of the present invention provide a common mode detection circuit that includes a differential input stage, a common mode replica stage, and an amplifier is disclosed. The differential input stage includes two differential inputs from which a signal is extracted dependent upon the common mode. A signal from the differential input stage representing the input common mode is electrically coupled to an input of the amplifier. Another input of the amplifier is electrically coupled to the common mode replica stage, and the amplifier outputs a signal indicative of the input common mode.

In some cases, the differential input stage includes two transistors, each with its gate electrically coupled to the respective differential inputs. In addition, the source of each of the respective transistors are electrically coupled to one input of the amplifier and to each other. The common mode replica stage includes another transistor, and the source of the transistor is electrically coupled to the other input of the amplifier. The gate of the transistor of the common mode replica stage is electrically coupled to an output of the amplifier.

In some instances, the common mode detection circuits include a current reference, and at least two current source circuits. The first current source circuit is electrically coupled to the current reference, and to the sources of the two transistors in the differential input stage. The first current source circuit provides a first current value. The other current source circuit is electrically coupled to the current reference, and to the source of the transistor of the common mode replica stage. This other current source circuit provides a current value approximately equal to one half the first current value. In particular cases, the aforementioned circuit further includes a resistor disposed between the first current source circuit and a junction of the sources of the two transistors of the differential input stage. In such cases, the resistor provides a voltage offset. In yet other cases, the aforementioned circuit includes resistors electrically coupled to the respective sources of the two transistors of the differential input stage to increase linearity for large differential signals.

In some instances, a common mode extractor circuit in accordance with an embodiment of the present invention is used to bias a gate of an input transistor. In such an application, the input transistors are effectively protected from high voltages as they are floated using the common mode of the input signals. As one example, the common mode extractor circuit provides an output indicative of the common mode, and this output indicative of the common mode is either applied directly to the gate of the input transistor, or is biased prior to application to the gate of the input transistor.

In other instances, a common mode extractor circuit in accordance with an embodiment of the present invention is used to extract information from a modulated common mode signal. In such cases, the common mode extractor circuit provides a signal indicative of the common mode to a comparator where it is compared with a reference voltage. The output of the comparator is a data signal representing a modulated common mode signal.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for providing differential signaling.

Some embodiments of the present invention provide a common mode detection circuit that includes a differential input stage, a common mode replica stage, and an amplifier is disclosed. As used herein the phrase "differential input stage" is used in its broadest sense to mean any circuit, system or device capable of receiving a differential signal. In one particular case, the differential input stage exhibits an input common mode, and includes two differential inputs each associated with a transistor. A signal from the differential input stage representing the input common mode is electrically coupled to an input of the amplifier. Another input of the amplifier is electrically coupled to the common mode replica stage, and the amplifier outputs a signal indicative of the input common mode. As used herein, the term "amplifier" is used in its broadest sense to mean any circuit, system or device capable of amplifying a signal where the amount of amplification is less than unity, unity, or greater than unity. Further, as used herein, the phrase "common mode replica stage" is used in its broadest sense to mean any circuit, system or device capable of replicating an output of another circuit or providing an output representative of an output of another circuit. In addition, the phrase "electrically coupled" is used in its broadest sense to mean any form of coupling whereby an electrical signal may be transferred from one device to another. Thus, an electrical coupling may be, but is not limited to, coupling via a conductive wire, coupling via a resistor, coupling via a capacitor, coupling via an inductor, coupling via a transistor, any combination of the aforementioned, and/or the like.

In some cases, the differential input stage includes two transistors each with its gate electrically coupled to the respective differential inputs. In addition, the source of each of the respective transistors are electrically coupled to one input of the amplifier. The common mode replica stage includes another transistor, and the source of the transistor is electrically coupled to the other input of the amplifier. The gate of the transistor of the common mode replica stage is electrically coupled to an output of the amplifier. As used herein, the term "gate" is used in its common sense to mean the control input of a transistor. As used herein, the terms "drain" and "source" may be used interchangeably to mean either or both of the non-controlling contacts of a transistor depending upon the desired connection of the circuit and/or device. In particular, where a drain and a source are called out in a claim of this patent, the drain merely means one contact of the transistor other than the gate, and the source merely means another contact of the transistor other than the gate.

Figure 2:
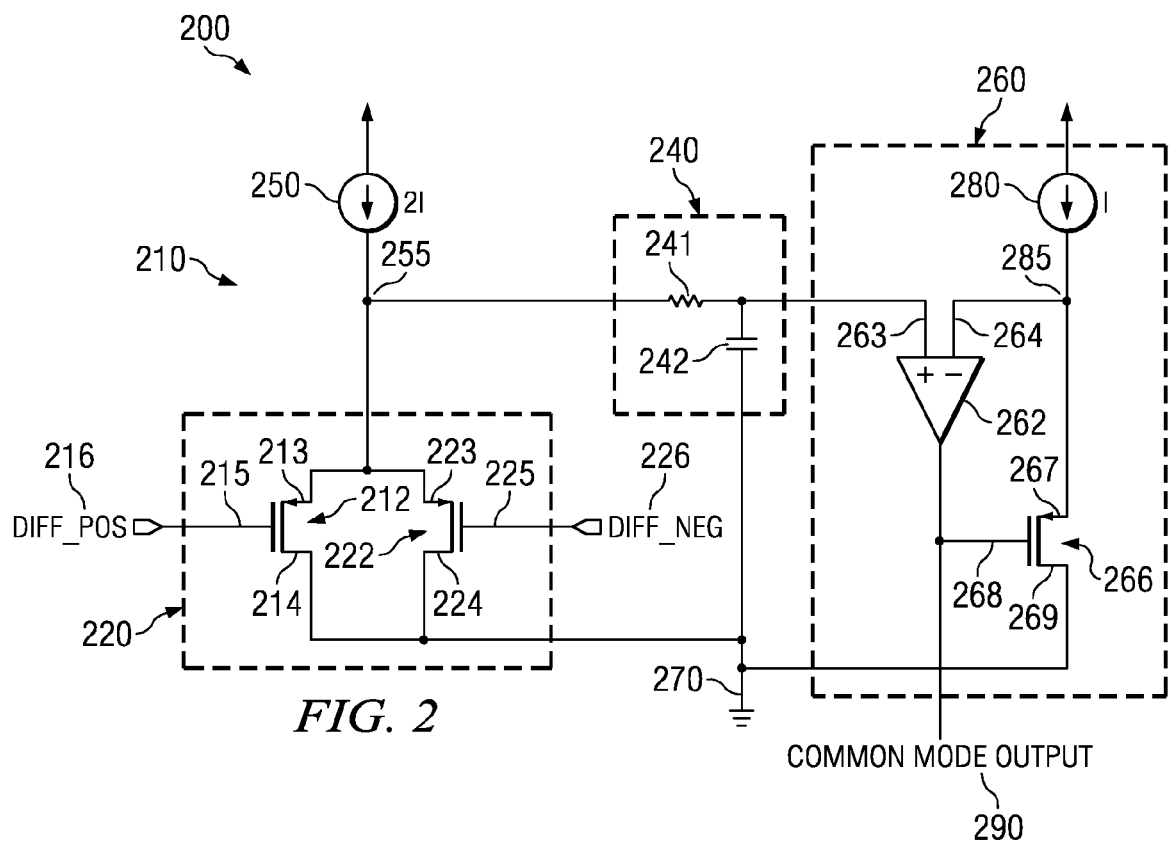
FIG. 2 shows a common mode extractor in accordance with various embodiments of the present invention.

Turning to FIG. 2, a common mode extractor circuit 200 in accordance with one or more embodiments of the present invention is depicted. Common mode extractor circuit 200 includes a common mode sense circuit 210, a filter 240, and a common mode output circuit 260. Common mode sense circuit 210 includes a differential input stage 220 and a current source 250. Differential input stage 220 includes a transistor 212 and a transistor 222. A gate 215 of transistor 212 is electrically coupled to a positive differential input (Diff_Pos) 216, and a gate 225 of transistor 222 is electrically coupled to a negative differential input (Diff_Neg) 226. A drain 214 of transistor 212 and a drain 224 of transistor 222 are electrically coupled to a ground 270. A source 213 of transistor 212 and a source 223 of transistor 222 are electrically coupled to a node 255 driven by current source 250.

Filter 240 may be a low pass filter that is optionally added to reject common mode noise and/or noise due to non-linearities caused by large differential signals. As depicted, filter 240 is a low pass filter that includes a resistor 241 and a capacitor 242. Where it is desirable to detect high frequency variations of the common mode, filter 240 may be eliminated. Based on the disclosure provided herein, one of ordinary skill in the art will recognize a variety of filter designs, and/or values for capacitor 242 and resistor 241 that may be used in accordance with the various embodiments of the present invention.

Common mode output stage 260 includes an amplifier 262, a current source 280, and a common mode replica stage comprised of a transistor 266. Amplifier 262 includes an input 263 and an input 264. Input 263 is electrically coupled to node 255 via filter 240, and input 264 is electrically coupled to a source 267 of transistor 266 at a node 285. Amplifier 262 drives a common mode output 290. In some cases, amplifier 262 is a simple amplifier with a gain determined by the amount of accuracy desired in common mode output 290. A gate 268 of transistor 266 is driven by common mode output 290. A drain 269 of transistor 266 is electrically coupled to ground 270. Current source 250 provides approximately two times the current provided by current source 280. This results in the same current density in each of transistor 212, transistor 222 and transistor 266 where a zero differential voltage is applied to differential inputs 216, 226. Based on the disclosure provided herein, one of ordinary skill in the art will recognize a variety of approaches and/or designs that may be employed to cause approximately the same current density in each of transistors 212, 222 and 266, and it will be noted that a size ratio of two to one is merely exemplary and that other designs are possible.

In common mode extractor circuit 200, differential inputs 216, 226 vary differentially over a common mode voltage (i.e., $V_{common\ mode}$) and the voltage at node 255 depends linearly upon the common mode voltage. Thus, the voltage at node 255 is defined in the following equation:

$$V_{node\ 255} = V_{common\ mode} + V_{function},$$

where $V_{function}$ is a composite of temperature and current related aspects. In operation, differential input signals 216, 226 are applied to respective transistors 212, 222 causing a differential current to pass through the respective transistors. Equations describing differential input signals 216, 226 are set forth below:

$$V_{Diff\_Pos} = V_{common\ mode} + \Delta V/2,$$

$$V_{Diff\_Neg} = V_{common\ mode} - \Delta V/2,$$

where $\Delta V$ is the magnitude of the difference between differential input signals 216, 226. As no bias/quiescent current passes through resistor 241 and the only current passing through resistor 241 arises from common mode noise and/or non-linearities due to large differentials, the voltage at input 263 of amplifier 262 is equivalent to $V_{node\ 255}$ in the quiescent case. Amplifier 262 operates to force the voltage at input 264 to match the voltage at input 263. Thus, $V_{node\ 285}$ is equal to $V_{node\ 255}$. As transistor 266 is substantially the same as both transistor 212 and transistor 222, current source 280 is approximately one half of current source 250, and all of the aforementioned transistors are disposed on the same substrate; voltage at node 285 is substantially the same as that exhibited at node 255. Again, it should be noted that based on the disclosure provided herein, one of ordinary skill in the art will recognize a variety of approaches and/or designs that may be employed to cause approximately the same current density in each of transistors 212, 222 and 266, and it will be noted that a size ratio of two to one is merely exemplary and that other designs are possible. In sum, for amplifier 262 to drive node 285 to the same voltage as that exhibited at node 255—common mode output 290 from amplifier 262 is equal to $V_{common\ mode}$. As common mode extractor circuit 200 uses the common mode replica stage that substantially replicates operation of common mode sense circuit 210, any non-linearity of common mode sense circuit is at least substantially cancelled. Thus, common mode extractor circuit 200 offers a solution to extracting an accurate representation of the common mode voltage that is substantially independent of process, supply voltage and temperature.

Figure 3:
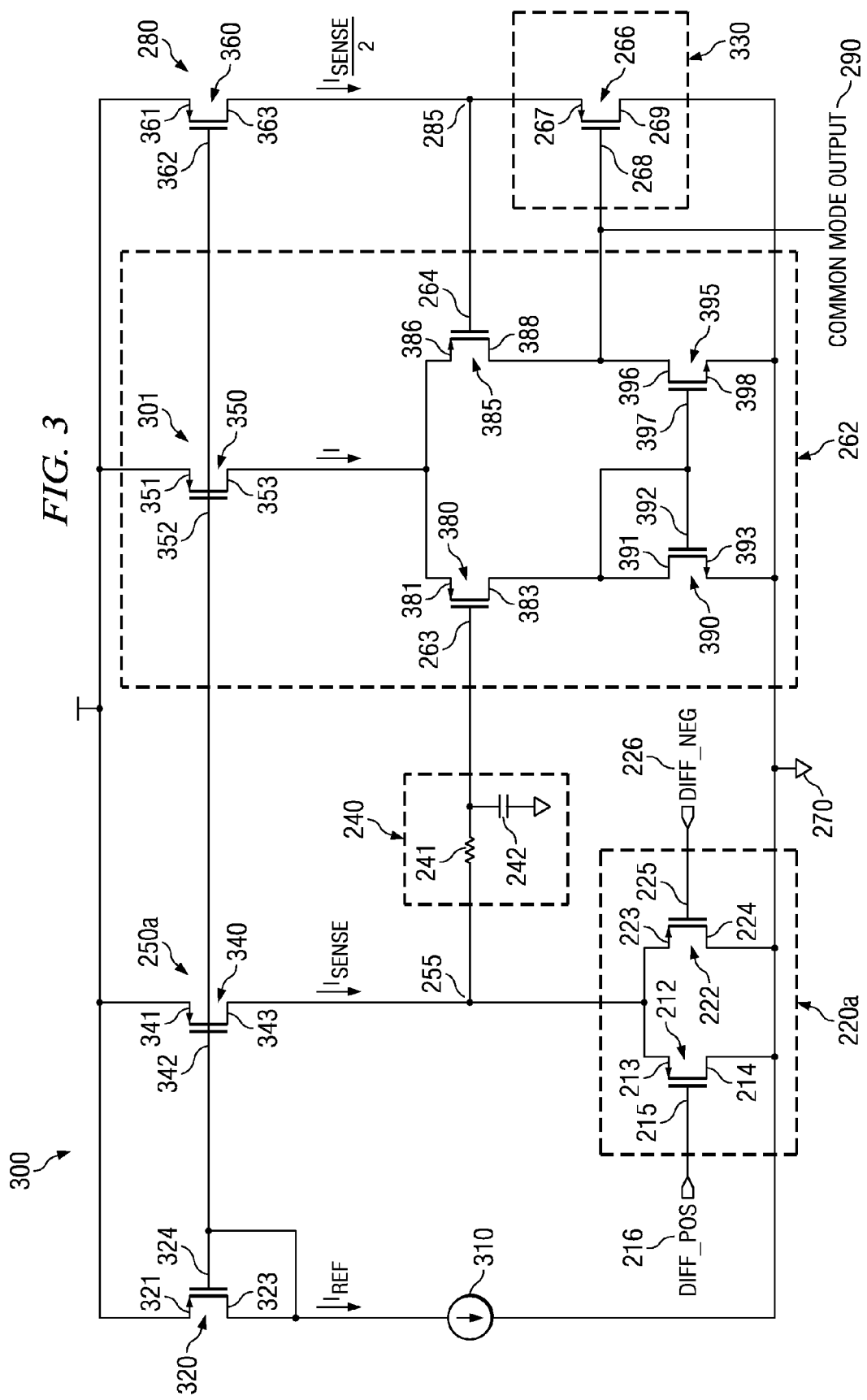
FIG. 3 depicts one implementation of a common mode extractor in accordance with various embodiments of the present invention.

Turning to FIG. 3, a specific implementation 300 of common mode extractor circuit 200 is shown in accordance with one or more embodiments of the present invention. Implementation 300 includes a reference current (i.e., $I_{REF}$) 310 that is mirrored by the other current sources 250a, 301, 280 in implementation 300. In particular, current source 250a is formed via a current mirror derived by electrically coupling a gate 324 of a transistor 320 with a gate 342 of a transistor 340. A source 321 of transistor 320 and a source 341 of transistor 340 are electrically coupled to a power source. Further, a drain 323 of transistor 320 is electrically coupled to gate 324 of transistor 320. A drain 343 of transistor 340 is electrically coupled to node 255. Current source 280 is formed via a current mirror derived by electrically coupling gate 324 of a transistor 320 with a gate 362 of a transistor 360. Source 361 of transistor 360 is electrically coupled to the power source, and a drain 363 of transistor 360 is electrically coupled to node 285. Of note, the size of transistor 360 is half the size of transistor 340. Thus, the current flowing from current source 250a (i.e., $I_{sense}$) is approximately twice the current flowing from current source 280. Current source 350 is formed via a current mirror derived by electrically coupling gate 324 of a transistor 320 with a gate 352 of a transistor 350. A source 351 of transistor 350 is electrically coupled to the power source, and a drain 353 of transistor 350 is electrically coupled to amplifier 262. No particular size ratio is specified between transistor 350 and other transistors as there is not a fundamental current relationship that is to be maintained. In at least some cases, the current sent to the amplifier defines the bandwidth thereof, and can be derived from the common mode signal bandwidth and/or common mode noise rejection that is desired.

In implementation 300, amplifier 262 is formed of four transistors 380, 385, 390, 395. The gate of transistor 380 is input 263 of amplifier 262, and the gate of transistor 385 is input 264 of amplifier 262. A source 381 of transistor 380, and a source 386 of transistor 385 are electrically coupled to current source 301. A drain 383 of transistor 380 is electrically coupled to a drain 391 and a gate 392 of transistor 390, and to a gate 397 of transistor 395. A drain 388 of transistor 385 and drain 396 of transistor 395 are electrically coupled to the output of amplifier 262. A source 393 of transistor 390 and a source 398 of transistor 395 are electrically coupled to ground 270.

Operation of implementation 300 is substantially the same as that described in relation to common mode extractor circuit 200. In particular, differential input stage 220a, amplifier 262 and common mode replica stage comprised of a transistor 266 are all biased with currents derived from a resistor tracking current source, $I_{ref}$. $I_{ref}$ is mirrored to generate $I_{sense}$ from current source 250a, $I_{sense}/2$ from current source 280, and a current from current source 301. Based on the disclosure provided herein, one of ordinary skill in the art will recognize a variety of approaches that may be used to generate $I_{ref}$. For example, $I_{ref}$ may be generated from a bandgap using either external or on chip resistance. Such a bandgap is typically available on a semiconductor device. It should be noted, however, that the voltage may be derived from any fixed voltage reference, and that the aforementioned band-gap approach is merely exemplary.

The voltage at node 255 depends linearly upon the common mode voltage. In operation, differential input signals 216, 226 are applied to respective transistors 212, 222 causing a differential current to pass through the respective transistors. As no bias/quiescent current passes through resistor 241 and the only current passing through resistor 241 arises from common mode noise and/or non-linearities due to large differentials, the voltage at input 263 (i.e., the gate of transistor 380) of amplifier 262 is approximately equivalent to $V_{node\ 255}$ in the quiescent case. Amplifier 262 operates to force the voltage at input 264 (i.e., the gate of transistor 385) to match the voltage at input 263 (i.e., the gate of transistor 380). Thus, $V_{node\ 285}$ is equal to $V_{node\ 255}$. Thus, amplifier 262 drives node 285 to the same voltage as that exhibited at node 255, common mode output 290 from amplifier 262 must be equal to $V_{common\ node}$. Similar to that described in relation to common mode extractor circuit 200, implementation 300 offers a solution to extracting an accurate representation of the common mode voltage that is substantially independent of process, supply voltage and temperature. Based on the disclosure provided herein, one of ordinary skill in the art will recognize that the choice of input pairs used for amplifier 262 and differential input stage 220a may depend in part upon the common mode range that is to be accommodated by a particular design. Further, at this juncture, it should be noted that while implementation 300 has been described in relation to PMOS pairs, a similar implementation based on the same principles of operation and providing similar results is possible using NMOS pairs. As will be appreciated from the foregoing discussion, implementation 300 requires only a very small area, and the circuit may be used for sensing very low common mode voltages (i.e., less than ground), or very high common mode voltages (i.e., higher than the supply voltage).

Figure 4:
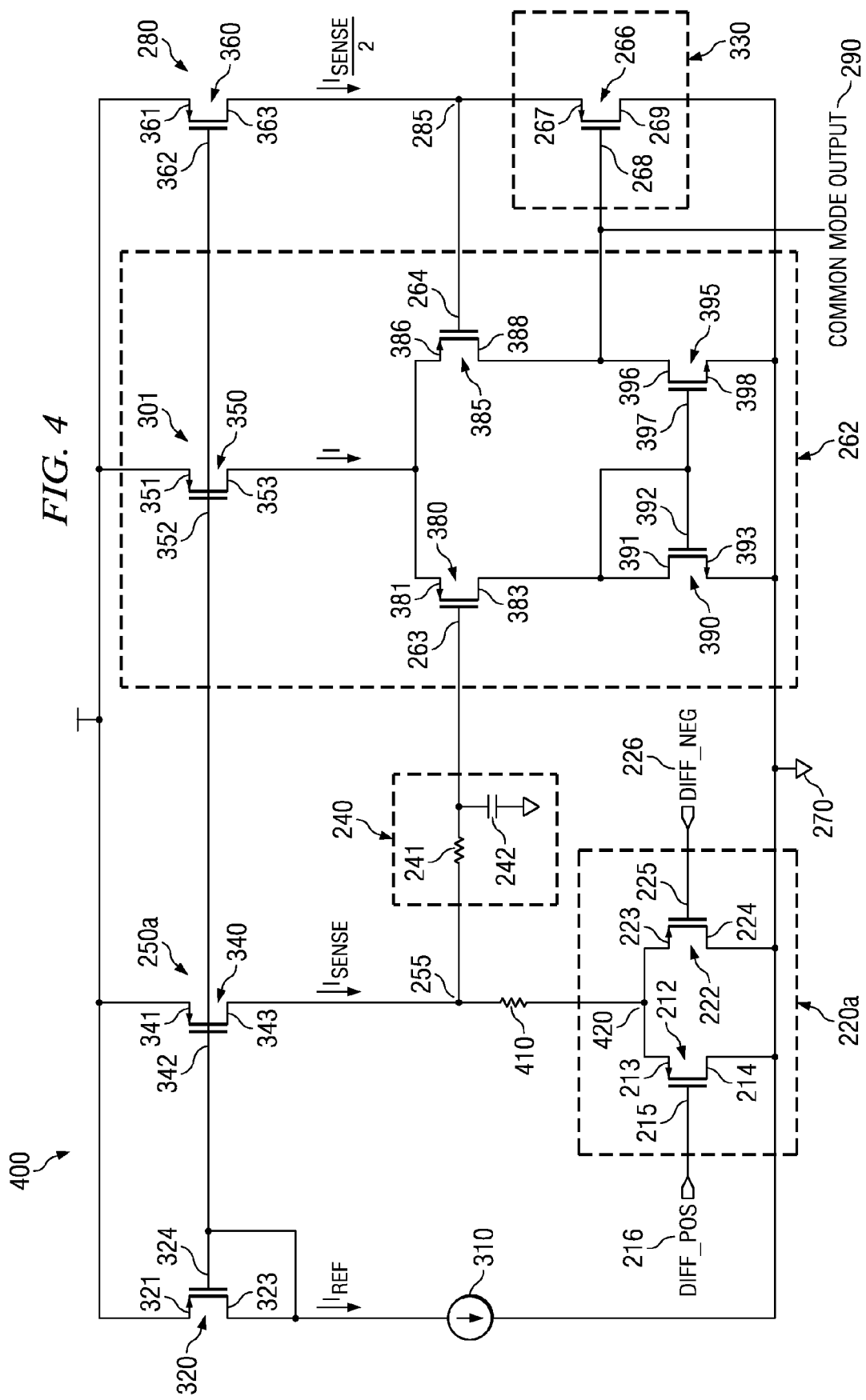
FIG. 4 depicts another implementation of a common mode extractor with a voltage offset in accordance with other embodiments of the present invention.

Negative common mode voltages are found in many types of serial data communication. In some cases, a linear common mode detection circuit is desirable. In such a case, it may be desirable to include a DC voltage shift to correctly sense a negative common mode voltage in the absence of a negative voltage supply. A circuit including such an offset, and in accordance with some embodiments of the present invention is depicted in FIG. 4. Turning to FIG. 4, an offset common mode extractor circuit 400 is shown. In addition to the elements discussed above in relation to implementation 300, offset common mode extractor circuit 400 includes an additional resistor 410 disposed between differential input stage 220a and node 255. Thus, differential input stage 220a is electrically coupled to node 255 via resistor 410. The value of resistor 410 is set based on the minimum desired common mode voltage, and the linear operating range of amplifier 262. As will be appreciated from FIG. 4, the voltage at node 255 is the voltage at a junction 420 between transistor 212 and transistor 222, plus the voltage drop across resistor 410. The voltage at node 255 is thus represented by the following equation:

$$V_{node\ 255} = (V_{common\ mode} + V_{function}) + R_{410} I_{sense},$$

where $V_{function}$ is a composite of temperature and current related aspects.

In operation, differential input stage 220a, amplifier 262 and common mode replica stage comprised of a transistor 266 are all biased with currents derived from a resistor tracking current source, $I_{ref}$. $I_{ref}$ is mirrored to generate $I_{sense}$ from current source 250a, $I_{sense}/2$ from current source 280, and a current from current source 301. $I_{sense}$ may be, but is not necessarily limited to, a resistor tracking current generated by applying a fixed voltage across a resistor on the same chip so that the voltage $I_{sense}*R4_{410}$ is a fixed voltage. The voltage at node 255 depends linearly upon the common mode voltage as offset by the voltage drop across resistor 410. In operation, differential input signals 216, 226 are applied to respective transistors 212, 222 causing a differential current to pass through the respective transistors. As only negligible current passes through resistor 241, the voltage at input 263 (i.e., the gate of transistor 380) of amplifier 262 is approximately equivalent to $V_{node\ 255}$. Amplifier 262 operates to force the voltage at input 264 to match the voltage at input 263. Thus, $V_{node\ 285}$ is equal to $V_{node\ 255}$. Thus, amplifier 262 drives node 285 to the same voltage as that exhibited at node 255, common mode output 290 from amplifier 262 must be equal to $V_{common\ mode}$ plus the voltage dropped across resistor 410, $R_{410}I_{sense}$. Offset common mode extractor 400, thus, operates to extract an accurate representation of the common mode voltage offset by a defined DC voltage. This output is substantially independent of process, supply voltage and temperature.

It should be noted that while the DC offset applied in the aforementioned embodiment of the invention is a positive offset, in some cases a negative offset may be desirable. In such cases, the circuit may be designed such that a negative offset is achieved. Such a negative offset may be desirable in the situation where the common mode is at a level that circuit operation may be affected by the available power supply. This may occur in the situation where NMOS pairs are used in place of the PMOS pairs. From the foregoing, it should be apparent that while offset common mode extractor circuit 400 has been described in relation to PMOS pairs, a similar implementation based on the same principles of operation and providing similar results is possible using NMOS pairs.

Figure 5:
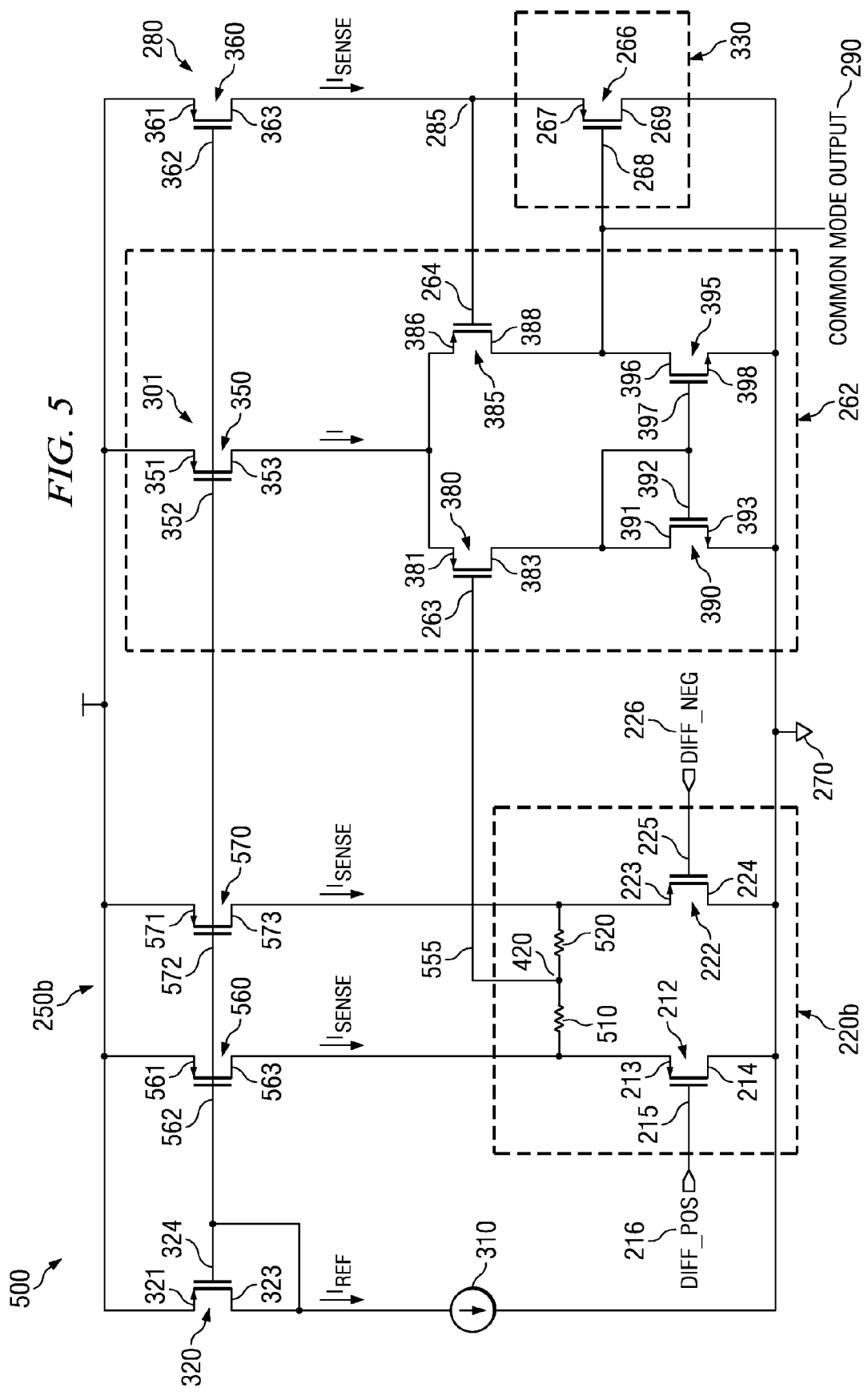
FIG. 5 depicts yet another implementation of a common mode extractor tailored for large differential signals in accordance with yet other embodiments of the present invention.

The aforementioned embodiments of the present invention work particularly well for relatively small differential voltages applied to differential inputs 216, 226. Where such small differentials are applied, small signal behavior may be assumed. This assumption does not apply where the differential voltage becomes large. In particular, for large differential voltages, due to the non-linearity of the MOSFET voltage/current dependence, the voltage at node 255 is not simply independent of the differential voltage. Turning to FIG. 5, a large differential voltage common mode extractor circuit 500 in accordance with one or more embodiments of the present invention is shown. In addition to the elements discussed above in relation to implementation 300, large differential voltage common mode extractor circuit 500 includes a current source 250b that is formed of two transistors 560, 570 formed as a current mirror with transistor 320. In particular, current source 250b is formed by coupling a gate 562 of transistor 560 and a gate 572 of transistor 570 to gate 324 of a transistor 320. A source 561 of transistor 560 and a source 571 of transistor 570 are electrically coupled to a power source. Further, a drain 563 of transistor 560 is electrically coupled to source 213 of transistor 212, and a drain 573 of transistor 570 is electrically coupled to source 223 of transistor 222. Source 213 of transistor 212 is electrically coupled to a node 555 via a resistor 510, and source 223 of transistor 222 is electrically coupled to node 555 via a resistor 520. The value of resistor 510 is the same as the value of resistor 520. Transistors 560, 570 and 360 are approximately the same size such that the same current, Isense, is provided via each of the respective transistors. This results in approximately the same current density in each of transistor 212, transistor 222 and transistor 266 where a zero differential voltage is applied to differential inputs 216, 226. No particular size ratio is specified between transistor 350 and other transistors as there is not a fundamental current relationship that is to be maintained.

Operation of large differential voltage common mode extractor circuit 500 is similar to that described in relation to FIG. 3 above, except that large differential voltage compensation is applied. In particular, differential input stage 220b, amplifier 262 and common mode replica stage comprised of a transistor 266 are all biased with currents derived from a resistor tracking current source, $I_{ref}$. $I_{ref}$ is mirrored to generate $I_{sense}$ from current source 250b, and $I_{sense}$ from current source 280, and a current from current source 301.

The voltage at node 555 is described by the following equation:

$$V_{node\ 555} = \sqrt{Isense/(K*(W/L))} * \sqrt{(1+Ir/Isense)/(1-Ir/Isense)} + V_{common\ mode} + |V_{Temp}|,$$

where $I_r$ is the current flowing through each of resistor 510 and resistor 520, $V_{Temp}$ is the temperature dependent component, and K(W/L) is the width to length characteristic times its current drive factor K of transistor 212 and transistor 222 (as well as transistor 266). Resistor 510 and resistor 520 may be chosen such that $I_r$ is relatively small compared with $I_{sense}$. Such an approach operates to increase the linearity provided by a large differential voltage common mode extractor circuit 500 during large differential swings.

The voltage at input 263 of amplifier 262 is equivalent to $V_{node\ 555}$. Amplifier 262 operates to force the voltage at input 264 (i.e., the gate of transistor 385) to match the voltage at input 263 (i.e., the gate of transistor 380). Thus, $V_{node\ 285}$ is equal to $V_{node\ 555}$. Thus, amplifier 262 drives node 285 to the same voltage as that exhibited at node 555. As transistor 266 is the same as both transistor 212 and transistor 222, common mode output 290 from amplifier 262 is equal to $V_{common\ mode}$. Large differential voltage common mode extractor circuit 500, thus, operates to extract an accurate representation of the common mode voltage across a large differential swing. This output is substantially independent of process, supply voltage and temperature. It should also be noted that based on the disclosure provided herein, one of ordinary skill in the art will recognize that the choice of input pairs used for amplifier 262 and differential input stage 220b may depend in part upon the common mode range that is to be accommodated by a particular design. Further, it should be noted that while large differential voltage common mode extractor circuit 500 has been described in relation to PMOS pairs, a similar implementation based on the same principles of operation and providing similar results is possible using NMOS pairs.

Figure 6:
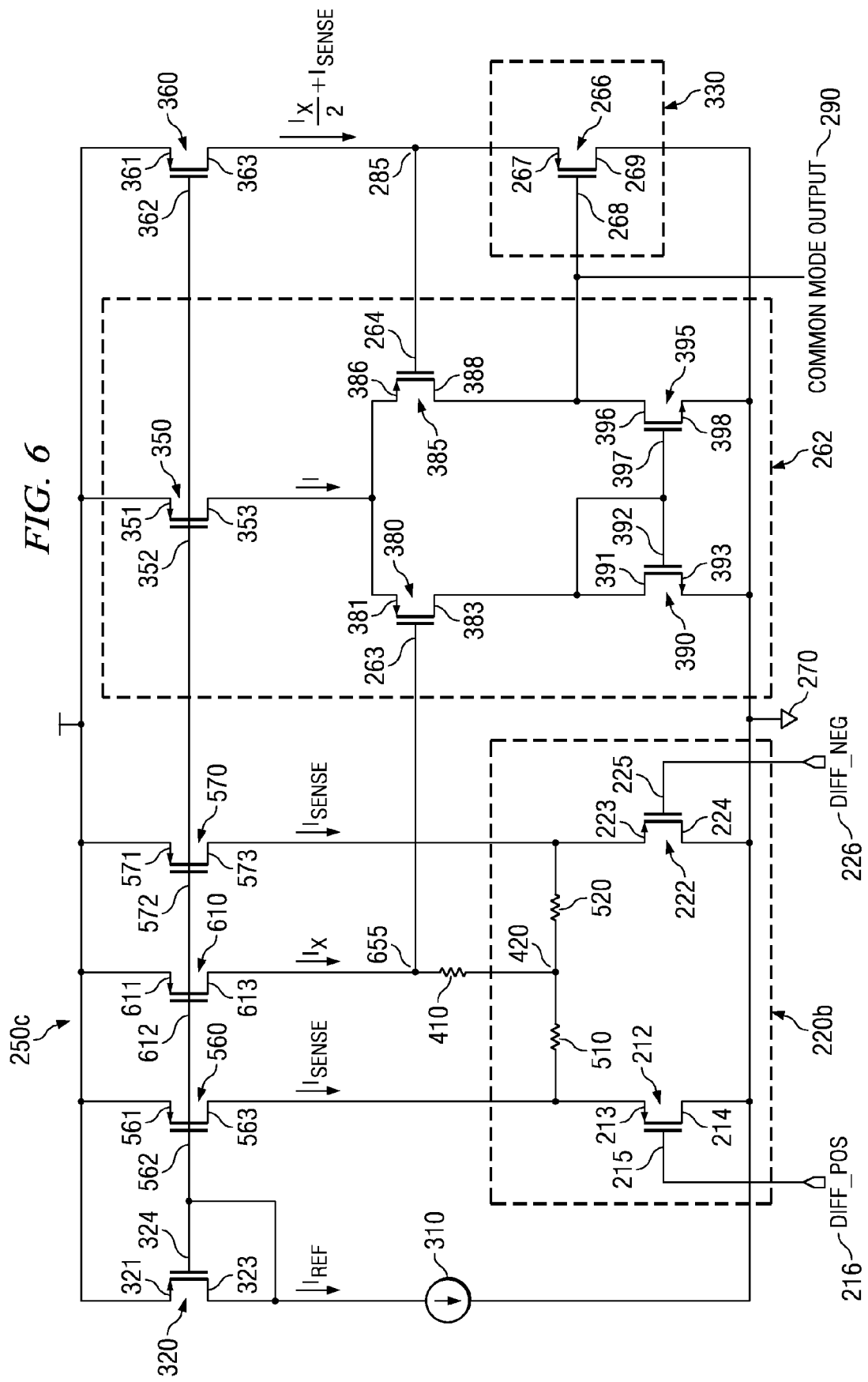
FIG. 6 depicts yet a further implementation of a common mode extractor with tailored for large differential signals and including a voltage offset in accordance with additional embodiments of the present invention.

Some embodiments of the present invention incorporate both offset and large signal compensation. Turning to FIG. 6, an offset and large gain offset common mode extractor circuit 600 in accordance with various embodiments of the present invention. Offset and large differential common mode extractor circuit 600 is effectively a combination of large differential voltage common mode extractor circuit 500 and offset common mode extractor circuit 400. The only substantial modification to the aforementioned combination is the addition of another current mirror as part of current source 250. In particular, current source 250c includes a transistor 610 formed into a current mirror with transistor 320. A gate 612 of transistor 610 is electrically coupled to gate 324 of transistor 320, a source 561 is electrically coupled to a power source, and a drain 613 of transistor 610 is electrically coupled to a node 655. Node 655 is electrically coupled via resistor 410 to a junction between resistor 510 and resistor 520 to provide offset and large differential compensation. Transistor 610 provides a current $I_x$. The current supplied by current source 360 is $I_x/2+I_{sense}$. In offset and large differential common mode extractor circuit 600, the addition of the resistors reduces the bandwidth of the circuit. To compensate for this reduction in bandwidth and retain the circuit linearity, bias currents may be increased.

Operation of offset and large differential common mode extractor circuit 600 is a hybrid of the operation discussed in relation to FIG. 4 and FIG. 5 above. Thus, the voltage at node 655 is equivalent to the voltage at node 285. As transistor 212, transistor 222 and transistor 266 are equivalent, common mode output 290 is described by the following equation:

$$V_{common\ mode\ out\ 290} = V_{common\ mode} + R_{410}I_x$$

Again, this output is substantially independent of process, supply voltage and temperature. Further, it should be noted that while offset and large differential common mode extractor circuit 600 has been described in relation to PMOS pairs, a similar implementation based on the same principles of operation and providing similar results is possible using NMOS pairs.

Figure 7:
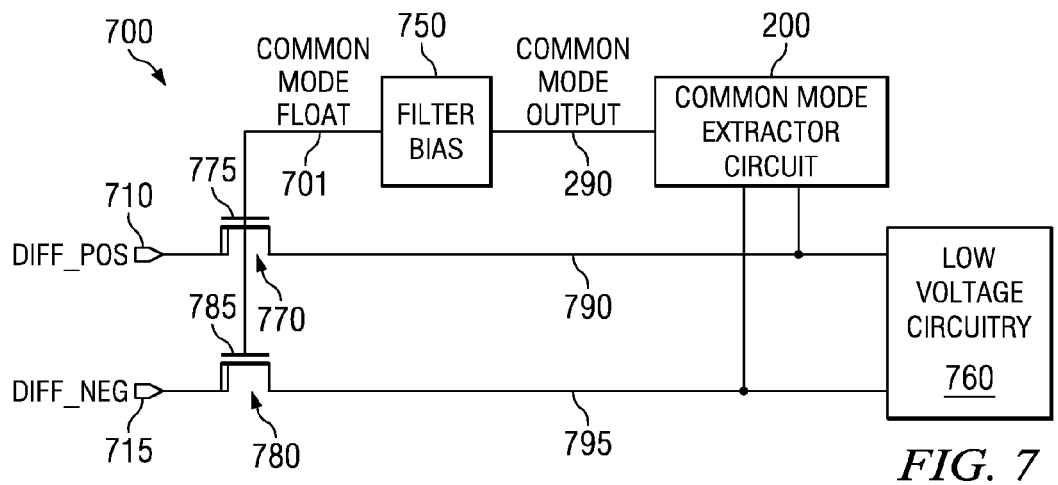
FIG. 7 illustrates an I/O protection circuit using common mode detection in accordance with particular embodiments of the present invention.

Common mode output 290 may be used in a number of different applications that are in accordance with other embodiments of the present invention. For example, as shown in FIG. 7, common mode output 290 may be used in relation to an I/O protection circuit 700 in accordance with some embodiments of the present invention. I/O protection circuit 700 includes differential inputs 710, 715 each attached to respective input transistors 770, 780. A signal 790 indicative of differential input 710, and a signal 795 indicative of differential input 715 are each attached to respective differential inputs 216, 226 of common mode extractor circuit 200. In addition, signals 790, 795 drive a circuit 760 comprising low voltage circuitry. Common mode output 290 from common mode extractor circuit 200 may be optionally filtered and/or offset by a filter 750 that provides a common mode float signal 701. Common mode float signal 701 is electrically coupled to a gate 775 of transistor 770 and a gate 785 of transistor 780. Thus, transistors 770, 780 are floated with a value derived from the common mode voltage. By floating transistors 770, 780 with the common mode voltage plus some offset, it can be assured that neither transistor will ever turn off. In one particular case, the offset is sufficient to turn either transistor 770 or transistor 780 on when the respective differential input 710, 715 voltage exhibits its largest separation. Thus, an exemplary common mode float 701 is represented by the following equation:

$$V_{common\ mode\ float\ 701} = V_{common\ mode} + V_{offset} + V_{transistors},$$

where $V_{transistor}$ is the voltage required to turn on transistors 770, 780. In this way, transistors 770, 780 are always on, yet the difference between the respective differential inputs 710, 715 and gates 775, 780 (i.e., $V_{GS}$) is not so large that the transistors are destroyed. I/O protection circuit may be particularly useful for implementing a high speed Universal Serial Bus interface with a substrate including ultra deep submicron gates.

Figure 1:
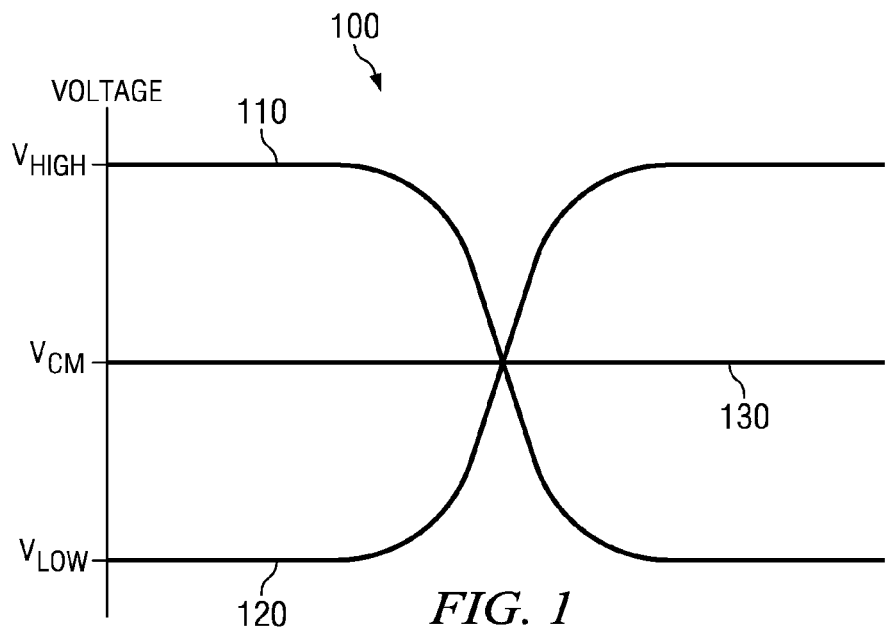
FIG. 1 is a diagram of a generic differential signal.
Figure 8A:
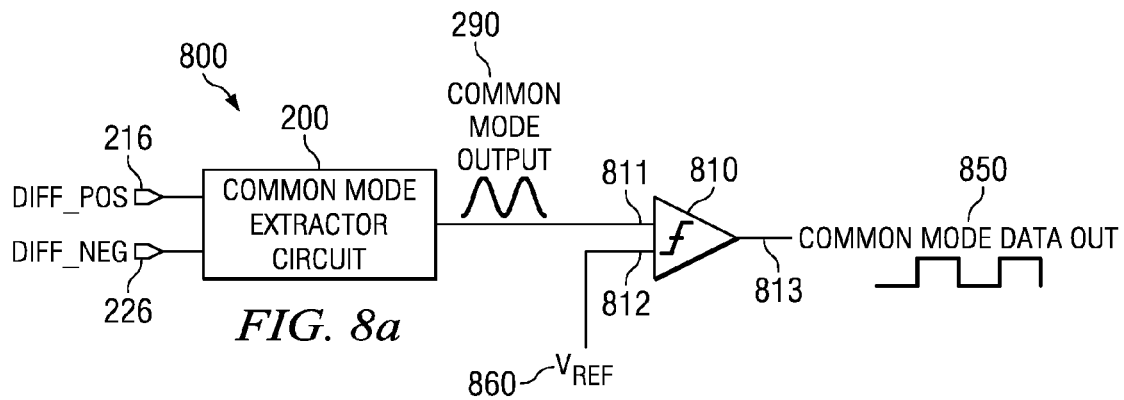
FIG. 8 shows a data transmission circuit for modulated common mode signals in accordance with embodiments of the present invention.
Figure 8B:
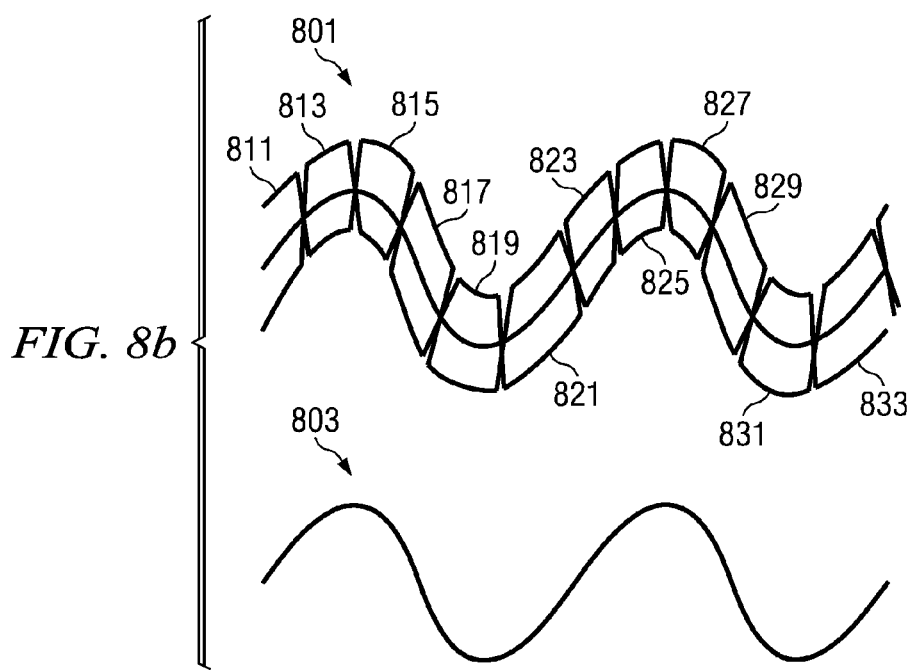

As another example of the application of common mode output 290, as shown in FIG. 8a, common mode output 290 may be used in relation to a data transmission circuit 800 in accordance with particular embodiments of the present invention. Data transmission circuit 800 receives a differential signal via differential inputs 216, 226. In this case, the differential signal is modulated. As such, the modulation carries data in addition to the data carried by the switching shown in FIG. 1 of the differential signal. This is shown in FIG. 8b where a modulated differential signal 801 is shown juxtaposed with just the modulated common mode 803. As can be seen, modulated differential 801 signal includes a number of differential sections 811, 813, 815, 817, 819, 821, 823, 825, 827, 829, 831, 833 that are switching similar to that shown in FIG. 1. Each of these differential sections includes what is being referred to as switching data—or standard differential signal data. In addition, modulated common mode 803 carries data that can be extracted. This data is being referred to herein as common mode data out 850.

Data transmission circuit 800 includes circuitry sufficient to extract common mode data out 850 from a signal such as modulated differential signal 801. In particular, common mode extractor circuit 200 provide common mode output 290 that is the modulated common mode signal (e.g., modulated common mode 803). Common mode output 290 is applied to an input 811 of a comparator 810 with another input 812 of comparator 810 electrically coupled to a reference voltage 860. Each time common mode output 290 exceeds threshold voltage (i.e., $V_{ref}$) 812 an output 813 of comparator 810 is set to a "high" signal, and each time common mode output 290 fails to exceed $V_{ref}$ output 813 is set to a "low" signal. This series of high and low signals comprise another source of data that may be transferred using a differential input.

It should be noted that the applications discussed in relation to FIG. 7 and FIG. 8 are only some of the applications that may be benefited by use of a common mode extractor circuit in accordance with one or more embodiments of the present invention. Based on the disclosure provided herein, one of ordinary skill in the art will appreciate a variety of situations to which embodiments of the present invention may be applied.

In conclusion, the present invention provides novel systems, methods and arrangements for exchanging data. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A common mode detection circuit, the circuit comprising:

an amplifier having a first input terminal and a second input terminal;

a differential input stage, wherein the differential input stage includes a first differential input and a second differential input, wherein the differential input stage exhibits an input common mode and also an error component in said input common mode, and wherein the differential input stage is electrically coupled to said first input terminal of the amplifier;

a common mode replica stage to generate a replica signal inclusive of said input common mode and said error component, wherein the replica signal is electrically coupled to said second input terminal of the amplifier; and whereby the amplifier drives a signal indicative of the input common mode with said error component being canceled at least substantially.

2. The circuit of claim 1, wherein the differential input stage includes a first transistor and a second transistor, wherein a gate of the first transistor is electrically coupled to the first differential input, wherein a gate of the second transistor is electrically coupled to the second differential input, wherein a source of the first transistor and a source of the second transistor are electrically coupled to an input of the amplifier.

3. The circuit of claim 2, wherein the input of the amplifier is a first input of the amplifier, wherein the common mode replica stage includes a third transistor, wherein the signal indicative of the input common mode is electrically coupled to a gate of the third transistor, and wherein a source of the third transistor is electrically coupled to a second input of the amplifier.

4. The circuit of claim 3, wherein the circuit further includes:
   a current reference;
   a current source circuit, wherein the current source circuit is electrically coupled to the current reference, wherein the current source circuit is electrically coupled to the source of the first transistor and the source of the second transistor, and wherein the current source circuit provides a current value as a function of the current reference.

5. The circuit of claim 4, wherein the current value is a first current value, wherein the current source circuit is a first current source circuit, and wherein the circuit further includes:
   a second current source circuit, wherein the second current source circuit is electrically coupled to the source of the third transistor, and wherein the second current source circuit provides a second current value approximately equal to one half the first current value.

6. The circuit of claim 4, wherein a resistor is disposed between the
   current source circuit and a junction of the source of the first transistor and the source of the second transistor, and wherein the resistor provides a voltage offset.

7. The circuit of claim 3, wherein the circuit further includes:
   a current reference;
   a first current source circuit, wherein the first current source circuit is electrically coupled to the current reference, wherein the first current source circuit is electrically coupled to the source of the first transistor, and wherein the first current source circuit provides a first current value as a function of the current reference;
   a second current source circuit, wherein the second current source circuit is electrically coupled to the current reference, wherein the second current source circuit is electrically coupled to the source of the second transistor, and wherein the second current source circuit provides a second current value as a function of the current reference;
   a first resistor disposed between the source of the first transistor and the input of the amplifier;
   a second resistor disposed between the source of the second transistor and the input of the amplifier; and
   wherein the first resistor and the second resistor are operable to increase linearity.

8. The circuit of claim 3, wherein the circuit further includes:
   a current reference;
   a first current source circuit, wherein the first current source circuit is electrically coupled to the current reference, wherein the first current source circuit is electrically coupled to the source of the first transistor, and wherein the first current source circuit provides a first current value as a function of the current reference;
   a second current source circuit, wherein the second current source circuit is electrically coupled to the current reference, wherein the second current source circuit is electrically coupled to the source of the second transistor, and wherein the second current source circuit provides a second current value as a function of the current reference; and
   a third current source circuit, wherein the third current source circuit is electrically coupled to the current reference, wherein the third current source circuit is electrically coupled to the source of the first transistor via a first resistor, wherein the third current source circuit is electrically coupled to the source of the second transistor via a second resistor, wherein the third current source circuit is electrically coupled to the input of the amplifier, and wherein the second current source circuit provides a second current value as a function of the current reference.

9. The circuit of claim 8, wherein the circuit further includes:
   a third resistor is disposed between the third current source circuit and a junction of the first resistor and the second resistor.

10. The circuit of claim 1, wherein the circuit further includes a filter disposed between the differential input stage and the amplifier.

11. The circuit of claim 10, wherein the filter is a low pass filter.

12. A differential receiver, the differential receiver comprising:
   a differential input stage, wherein the differential input stage includes a first
   differential input and a second differential input, wherein the differential input stage exhibits an input common mode; and wherein the differential input stage is electrically coupled to an amplifier;
   a common mode replica stage, wherein the common mode replica stage is electrically coupled to the amplifier;
   wherein the amplifier drives an amplifier output, and wherein the amplifier output is indicative of the input common mode; and
   a comparator, wherein a first input of the comparator is electrically coupled to the amplifier output, wherein a second input of the comparator is electrically coupled to a reference voltage, and wherein the comparator is operable to drive a comparator output, and
   wherein the comparator output is a non-differential representation of a received differential signal.

13. The circuit of claim 12, wherein:
the differential input stage includes a first transistor and a second transistor,
   wherein a gate of the first transistor is electrically coupled to the first differential input,
   wherein a gate of the second transistor is electrically coupled to the second differential input,
   wherein a source of the first transistor and a source of the second transistor are electrically
coupled to a first input of the amplifier; and
the common mode replica stage includes a third transistor,
   wherein the signal indicative of the input common mode is electrically coupled to a gate of the third transistor, and wherein a source of the third transistor is electrically coupled to a second input of the transistor.

14. The circuit of claim 13, wherein the circuit further includes:
a current reference;
a first current source circuit, wherein the first current source circuit is electrically coupled to the current reference, wherein the first current source circuit is electrically coupled to the source of the first transistor and to the source of the second transistor via a resistor, wherein the resistor provides a voltage offset, and wherein the first current source circuit provides a first current value as a function of the current reference; and
a second current source circuit, wherein the second current source circuit is electrically coupled to the source of the third transistor, and wherein the second current source circuit provides a second current value approximately equal to one half the first current value.

15. The circuit of claim 13, wherein the circuit further includes:
a current reference;
a first resistor and a second resistor, wherein the a first end of the first resistor and a first end of the second resistor are connected, wherein a second end of the first resistor is electrically coupled to the source of the first transistor, and wherein a second end of the second resistor is electrically coupled to the source of the second transistor;
a first current source circuit, wherein the first current source circuit is electrically coupled to the current reference, wherein the first current source circuit is electrically coupled to the first end of the first resistor and to the first end of the second resistor, and wherein the first current source circuit provides a first current value as a function of the current reference;
a second current source circuit, wherein the second current source circuit is electrically coupled to the current reference, wherein the second current source circuit is electrically coupled to the source of the second transistor, and wherein the second current source circuit provides a second current value as a function of the current reference; and
wherein the first resistor and the second resistor are operable to increase linearity.

16. The circuit of claim 13, wherein the circuit further includes:
a current reference;
a first current source circuit, wherein the first current source circuit is electrically coupled to the current reference, wherein the first current source circuit is electrically coupled to the source of the first transistor, and wherein the first current source circuit provides a first current value as a function of the current reference;
a second current source circuit, wherein the second current source circuit is electrically coupled to the current reference, wherein the second current source circuit is electrically coupled to the source of the second transistor, and wherein the second current source circuit provides a second current value as a function of the current reference; and
a third current source circuit, wherein the third current source circuit is electrically coupled to the current reference, wherein the third current source circuit is electrically coupled to the source of the first transistor via a first resistor, wherein the third current source circuit is electrically coupled to the source of the second transistor via a second resistor, wherein the third current source circuit is electrically coupled to the input of the amplifier, and wherein the second current source circuit provides a second current value as a function of the current reference.

17. The circuit of claim 13, wherein the circuit further includes:
a third resistor is disposed between the third current source circuit and a junction of the first resistor and the second resistor.

18. The circuit of claim 12, wherein the circuit further comprises:
a comparator, wherein a first input of the comparator is electrically coupled to the amplifier output, and wherein a second input of the comparator is electrically coupled to a reference voltage; and
wherein an output of the comparator is a data signal representing a modulated common mode signal.

19. A common mode detection circuit, the circuit comprising:
a common mode extractor circuit, wherein the common mode extractor circuit provides a signal offset from the common mode; and
a differential input circuit, wherein the differential input circuit includes a first transistor electrically coupled to a first differential input, a second transistor electrically coupled to a second differential input, and wherein a source of the first transistor and a source of the second transistor are each electrically coupled to the signal offset from the common mode,
wherein a signal indicative of the common mode is a first signal indicative of the common mode, wherein the common mode extractor circuit includes:
a differential input stage, wherein the differential input stage includes a first input that is electrically coupled to the first transistor, wherein the differential input includes a second input electrically coupled to the second differential input, wherein the differential input stage exhibits the common mode; and wherein the differential input stage is electrically coupled to an amplifier;
a common mode replica stage, wherein the common mode replica stage is electrically coupled to the amplifier; and
wherein the amplifier drives the signal indicative of the common mode.

* * * * *